US011171274B2

(12) United States Patent
Nakai et al.

(10) Patent No.: US 11,171,274 B2
(45) Date of Patent: *Nov. 9, 2021

(54) LIGHT EMITTING ELEMENT AND LIGHT EMITTING DEVICE

(71) Applicant: NICHIA CORPORATION, Anan (JP)

(72) Inventors: Hiroki Nakai, Anan (JP); Kensuke Yamaoka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/848,534

(22) Filed: Apr. 14, 2020

(65) Prior Publication Data

US 2020/0243740 A1    Jul. 30, 2020

Related U.S. Application Data

(63) Continuation of application No. 16/275,014, filed on Feb. 13, 2019, now Pat. No. 10,658,559.

(30) Foreign Application Priority Data

Feb. 28, 2018 (JP) .............................. JP2018-035365
Nov. 30, 2018 (JP) .............................. JP2018-224687

(51) Int. Cl.
*H01L 33/64* (2010.01)
*H01L 27/15* (2006.01)
(Continued)

(52) U.S. Cl.
CPC .......... *H01L 33/647* (2013.01); *H01L 27/156* (2013.01); *H01L 33/38* (2013.01);
(Continued)

(58) Field of Classification Search
CPC ... H01L 33/647; H01L 33/387; H01L 33/382; H01L 33/641; H01L 33/62; H01L 33/60;
(Continued)

(56) References Cited

U.S. PATENT DOCUMENTS 9,431,579 B2 * 8/2016 Wu ....................... H01L 33/382
2010/0117111 A1 * 5/2010 Illek ..................... H01L 33/382
257/98
(Continued)

FOREIGN PATENT DOCUMENTS

EP    2587537 A2   5/2013
JP   2010-525586 A  7/2010
(Continued)

OTHER PUBLICATIONS

Notice of Allowance of the U.S. Appl. No. 16/275,014, dated Jan. 27, 2020.

*Primary Examiner* — Karen Kusumakar
(74) *Attorney, Agent, or Firm* — Global IP Counselors, LLP

(57) ABSTRACT

A light emitting element includes a semiconductor layered body, an insulating film, first and second electrodes, first external connecting parts and at least one second external connecting part. The semiconductor layered body includes a first semiconductor layer, a light emitting layer, and a second semiconductor layer. The first electrode is connected to the first semiconductor layer at exposed parts through openings in the insulating film, and partially arranged on the second semiconductor layer via the insulating film. The first external connecting parts are connected to the first electrode. The first external connecting parts are spaced apart from the exposed parts in a plan view, and at least two of the first external connecting parts being arranged between at least one set of adjacent ones of the exposed parts in the plan view. The second external connecting part is connected to the second electrode.

17 Claims, 9 Drawing Sheets

(51) Int. Cl.
  *H01L 33/38*   (2010.01)
  *H01L 33/44*   (2010.01)
  *H01L 33/50*   (2010.01)
  *H01L 33/56*   (2010.01)
  *H01L 33/60*   (2010.01)
  *H01L 33/62*   (2010.01)
  *H01L 33/32*   (2010.01)
  *H01L 33/40*   (2010.01)

(52) U.S. Cl.
  CPC .......... *H01L 33/382* (2013.01); *H01L 33/387* (2013.01); *H01L 33/44* (2013.01); *H01L 33/505* (2013.01); *H01L 33/56* (2013.01); *H01L 33/60* (2013.01); *H01L 33/62* (2013.01); *H01L 33/641* (2013.01); *H01L 33/32* (2013.01); *H01L 33/405* (2013.01)

(58) Field of Classification Search
  CPC ....... H01L 33/56; H01L 33/505; H01L 33/44; H01L 33/38; H01L 27/156; H01L 33/405; H01L 33/32
  See application file for complete search history.

(56) References Cited

U.S. PATENT DOCUMENTS

| | | |
|---|---|---|
| 2015/0349207 A1 | 12/2015 | Sogo et al. |
| 2016/0043290 A1 | 2/2016 | Sogo et al. |

FOREIGN PATENT DOCUMENTS

| | | |
|---|---|---|
| JP | 2014-207267 A | 10/2014 |
| JP | 2015-226038 A | 12/2015 |
| JP | 2016-009749 A | 1/2016 |
| JP | 2016-039324 A | 3/2016 |
| WO | 2015053600 A1 | 4/2015 |
| WO | 2015127744 A1 | 9/2015 |

* cited by examiner

LIGHT EMITTING ELEMENT AND LIGHT EMITTING DEVICE

CROSS-REFERENCE TO RELATED APPLICATION

This application is a continuation application of U.S. patent application Ser. No. 16/275,014 filed on Feb. 13, 2019. This application claims priority to Japanese Patent Application No. 2018-035365 filed on Feb. 28, 2018 and Japanese Patent Application No. 2018-224687 filed on Nov. 30, 2018. The entire disclosures of U.S. patent application Ser. No. 16/275,014, and Japanese Patent Application Nos. 2018-035365 and 2018-224687 are hereby incorporated herein by reference in their entirety.

BACKGROUND

The present disclosure relates to a light emitting element and a light emitting device.

It has been proposed that a light emitting element includes: a semiconductor structure including an n-type semiconductor layer and a light emitting layer and a p-type semiconductor layer layered such that part of the n-type semiconductor layer is exposed; an insulating film provided with a plurality of openings formed on the semiconductor structure; an n-electrode connected via an opening among the plurality of openings and provided on the n-type semiconductor layer exposed outside the light emitting layer and the p-type semiconductor layer; a p-electrode connected via an opening among the plurality of openings and provided on the p-type semiconductor layer; a p-side external connecting part connected to the p-electrode; and an n-side external connecting part connected to the n-electrode (for example, see JP 2010-525586 A).

SUMMARY

In the conventional light emitting element as described above, in order to ensure the heat dissipation, preferably the n-side external connecting part and the p-side external connecting part have larger area size. However, thermal stress is concentrated around the region where the n-type semiconductor layer is exposed by the large-area external connecting parts provided on the n-type semiconductor layer exposed outside the light emitting layer and the p-type semiconductor layer in bonding the light emitting element to the substrate. This may cause breakage of the insulating film and the electrode formed at the region where the n-type semiconductor layer is exposed.

Accordingly, the present disclosure is to provide a light emitting element and a light emitting device with secured or improved heat dissipation property, while being prevented from breakage of an insulating film, an electrode and the like attributed to thermal stress in bonding the light emitting device to a substrate.

The present disclosure includes the following aspects.
(1) A light emitting element includes a semiconductor layered body, an insulating film, a first electrode, a second electrode, a plurality of first external connecting parts and at least one second external connecting part. The semiconductor layered body includes a first semiconductor layer, a light emitting layer, and a second semiconductor layer, with the light emitting layer being positioned between the first semiconductor layer and the second semiconductor layer. The first semiconductor layer is exposed from the light emitting layer and the second semiconductor layer at a plurality of exposed parts when viewed from a second semiconductor layer side of the semiconductor layered body. The insulating film covers the semiconductor layered body. The insulating film defines a plurality of openings respectively arranged above the plurality of exposed parts of the first semiconductor layer. The first electrode is connected to the first semiconductor layer at the exposed parts through the openings in the insulating film, and partially arranged on the second semiconductor layer via the insulating film. The second electrode is electrically connected to the second semiconductor layer. The first external connecting parts are connected to the first electrode. The first external connecting parts are spaced apart from the exposed parts in a plan view. At least two of the first external connecting parts are arranged between at least one set of adjacent ones of the exposed parts in the plan view. The second external connecting part is connected to the second electrode.
(2) A light emitting device includes: a substrate including a wiring pattern on an upper surface; the light emitting element according to the above aspect, the light emitting element being flip-chip mounted on the wiring pattern via the first external connecting parts and the at least one second external connecting part; and a covering member covering the substrate and the light emitting element including the first external connecting parts and the at least one second external connecting part.

Certain embodiments in the present disclosure can realize the light emitting element and the light emitting device with ensured or improved heat dissipation, and alleviated breakage of the insulating film, the electrode and the like attributed to thermal stress in bonding the light emitting element to the substrate.

DETAILED DESCRIPTION

Figure 1A:
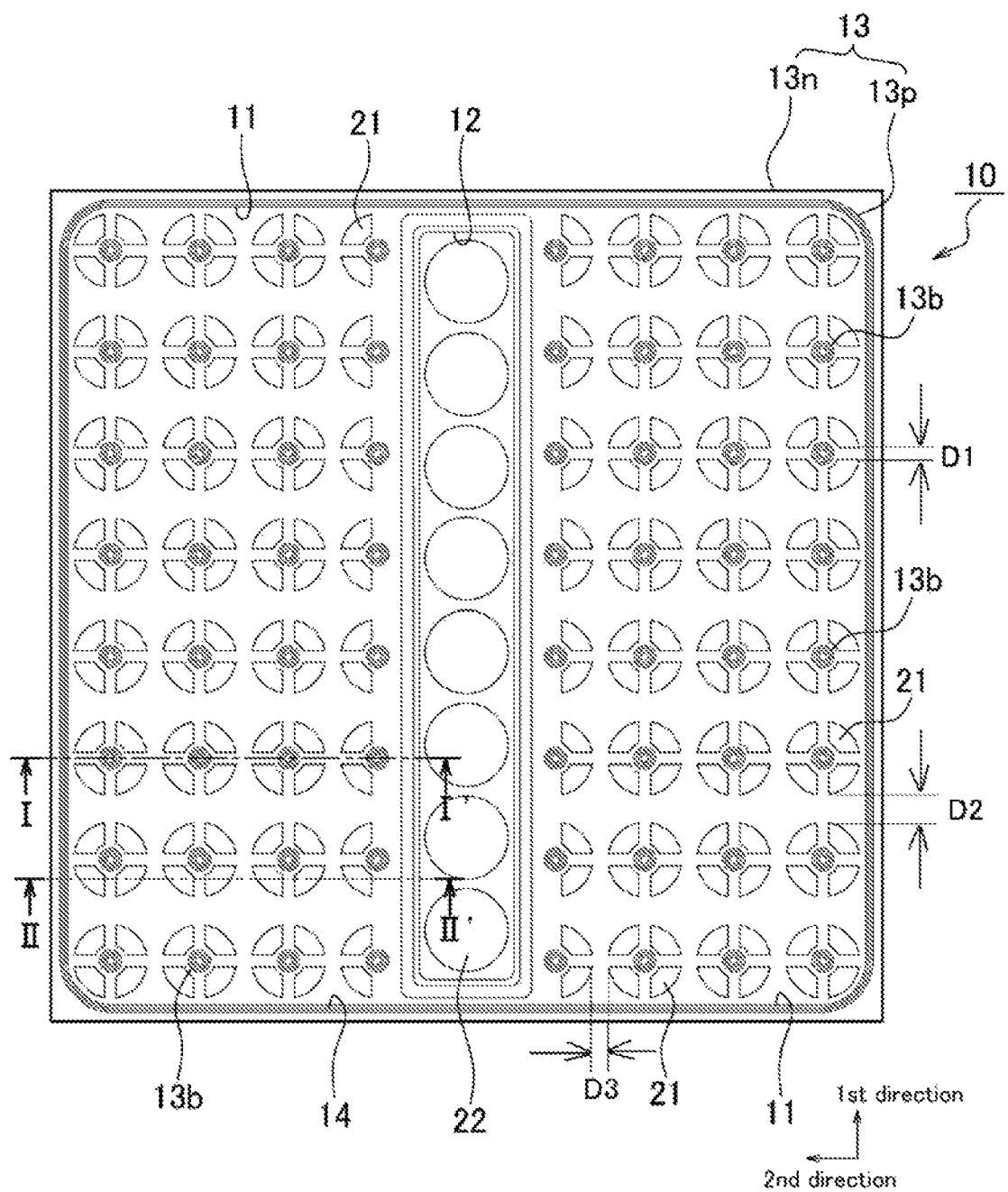
FIG. 1A is a plan view schematically showing a light emitting element according to a first embodiment of the present disclosure.

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

Light Emitting Element 10

A light emitting element according to one embodiment of the present disclosure includes: a semiconductor layered body, an insulating film, a first electrode, a second electrode, a plurality of first external connecting parts and at least one second external connecting part. The semiconductor layered body includes a first semiconductor layer, a light emitting layer, and a second semiconductor layer, with the light emitting layer being positioned between the first semiconductor layer and the second semiconductor layer. The first semiconductor layer is exposed from the light emitting layer and the second semiconductor layer at a plurality of exposed parts when viewed from a second semiconductor layer side of the semiconductor layered body. The insulating film covers the semiconductor layered body. The insulating film defines a plurality of openings respectively arranged above the plurality of exposed parts of the first semiconductor layer. The first electrode is connected to the first semiconductor layer at the exposed parts through the openings in the insulating film, and partially arranged on the second semiconductor layer via the insulating film. The second electrode is electrically connected to the second semiconductor layer. The first external connecting parts are connected to the first electrode. The first external connecting parts are spaced apart from the exposed parts in a plan view. The second external connecting part is connected to the second electrode. A group comprising at least one of the first external connecting parts and other group comprising at least one of the first external connecting parts respectively surround adjacent ones of the exposed parts while being spaced apart from each other in the plan view.

Figure 1B:
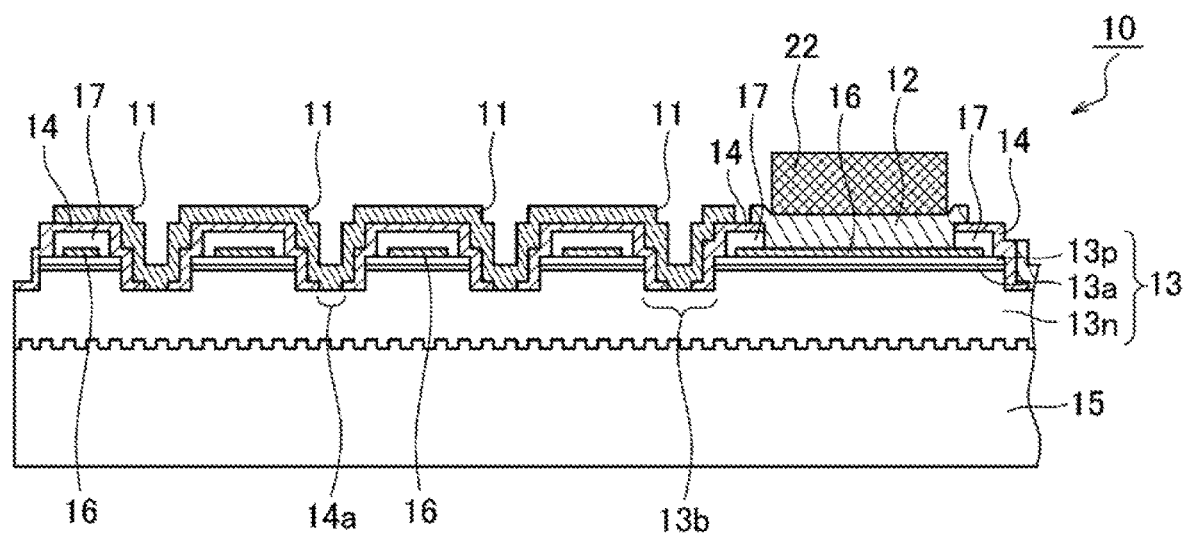
FIG. 1B is a cross-sectional view taken along line I-I' in FIG. 1A.
Figure 1C:
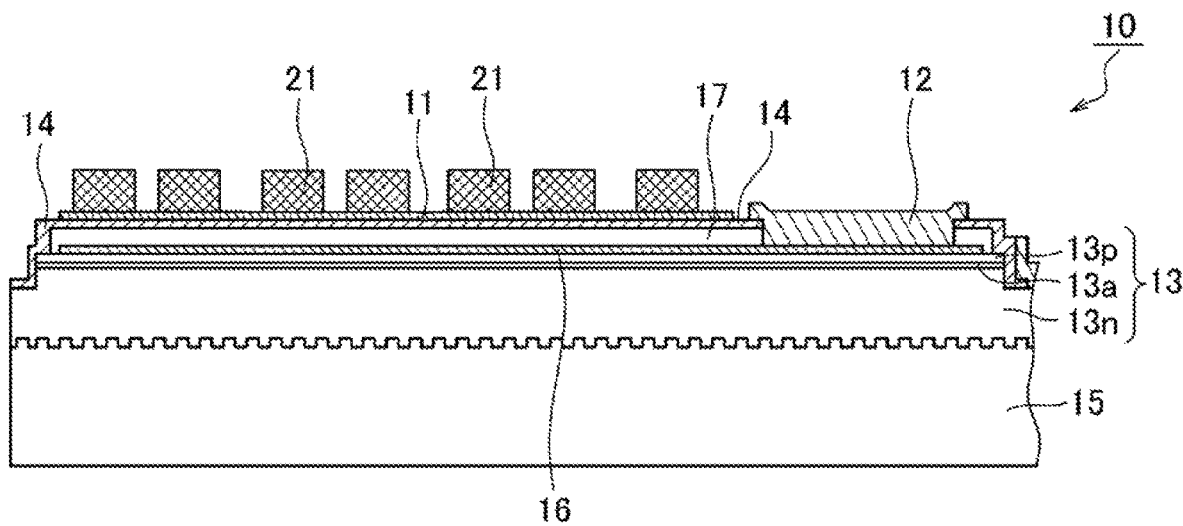
FIG. 1C is a cross-sectional view taken along line II-II' in FIG. 1A.

That is, as shown in FIGS. 1A to 1C, a light emitting element 10 according to certain embodiment of the present disclosure includes a semiconductor layered body 13, an insulating film 14, a first electrode 11 and a second electrode 12, and first external connecting parts 21 and second external connecting parts 22. In particular, a plurality of the first external connecting parts 21 is provided, and each have a fragmented shape corresponding to a fragment of a prescribed shape as seen in a plan view. The plurality of first external connecting parts 21 surrounds one exposed part as seen in a plan view while being spaced apart from the exposed part. Further, a group of first external connecting parts and other group of first external connecting parts respectively surrounding adjacent exposed parts are spaced apart from each other. The planar shape of the light emitting element 10 may be, for example, a polygonal shape such as a substantially quadrangular shape or a hexagonal shape, any of the foregoing shapes having their corners rounded, or a circular shape or an oval shape. Among such shapes, a substantially quadrangular shape is preferable.

Such a light emitting element 10 has the structure suitable for flip-chip mounting using the side of a surface on which the first electrode 11 and the second electrode 12, and the first external connecting parts 21 and the second external connecting parts 22 are provided as a mounting surface. In the light emitting element 10, the surface opposite to the mounting surface serves as the main light extraction surface.

With such a light emitting element, in bonding the light emitting element to a substrate which is described below, the first external connecting parts are arranged around each exposed part 13b. Therefore, the heat dissipation property is secured or improved. Further, damage on the insulating film and/or the electrode around the exposed part 13b is less likely to be occur. Still further, by virtue of the first external connecting parts each being fragmented, and by virtue of a group of first external connecting parts and other group of first external connecting parts being respectively surrounding adjacent exposed parts while being spaced apart from each other, in forming a covering member in the light emitting device which is described below, flowability of an uncured resin material forming the covering member is less likely to be hindered between the light emitting element and the substrate for the light emitting element flip-chip mounted on the substrate. Therefore, the covering member can easily be disposed to reach immediately below the light emitting element. This can ensure the light extraction efficiency of the light emitting device.

Semiconductor Layered Body 13

The semiconductor layered body 13 configuring the light emitting element 10 is made up of a first semiconductor layer 13n, a light emitting layer 13a, and a second semiconductor layer 13p being layered in this sequence. Such a semiconductor layered body 13 is normally formed on an insulating supporting substrate 15. The supporting substrate 15 may be ultimately removed from the light emitting element 10. The light emitting layer 13a and the second semiconductor layer 13p positioned on the upper surface of the light emitting layer 13a are positioned at predetermined regions in the upper surface of the first semiconductor layer 13n. That is, the second semiconductor layer 13p and the light emitting layer 13a are partially absent on the first semiconductor layer 13n. The regions where the first semiconductor layer 13n is exposed outside the light emitting layer 13a and the second semiconductor layer 13p on a side close to the second semiconductor layer are referred to as the exposed parts 13b. In other words, the semiconductor layered body 13 includes a plurality of holes spaced apart from each other as seen in a plan view at the surface of the second semiconductor layer 13p. At the bottom surface of each hole, the first semiconductor layer 13n is exposed. The first semiconductor layer 13n exposed at the bottom surface of the hole is referred to as the exposed part 13b. Each hole penetrates through the second semiconductor layer 13p and the light emitting layer 13a. At the lateral surface of each hole, the second semiconductor layer 13p, the light emitting layer 13a, and the first semiconductor layer 13n are partially exposed.

The shape, size, position, and the number of the exposed parts 13b can be set as appropriate in accordance with the size, shape, electrode pattern and the like of the intended light emitting element.

The shape of each exposed part 13b is, for example, a circular or oval shape, or a polygonal shape such as a triangular, quadrangular, or hexagon shape as seen in a plan view. Among such shapes, a circular or a shape similar to a circle (for example, an oval shape or a polygonal shape equal to or greater than a hexagon in the number of corners)

is preferable. The size of each exposed part 13b can be adjusted as appropriate in accordance with the size of the semiconductor layered body, the required output, luminance and the like of the light emitting element. For example, preferably, the diameter of each exposed part 13b in a range of about several tens of micrometers to several hundred micrometers. From other point of view, preferably, the diameter is about 1/20 to 1/5 as great as one side of the semiconductor layered body. Further, while the distance between adjacent exposed parts 13b may be identical among all the exposed parts 13b or may be different among part of or all the exposed parts 13b. Preferably the distance between adjacent exposed parts 13b is identical among all the exposed parts 13b. For example, the distance between the exposed parts 13b may be about 1/15 to 1/5 as great as one side of the semiconductor layered body. Among such examples, the distance is preferably greater than the diameter of the exposed part.

Preferably, the exposed parts 13b are regularly arranged in one light emitting element. This arrangement can reduce luminance non-uniformity of the light emitting element, and allows light to be substantially uniformly extracted. Specifically, preferably, the exposed parts 13b are regularly arranged in a plurality of columns in a first direction. "The first direction" in the present specification refers to, for example, one direction parallel to one side of the semiconductor layered body 13 or the light emitting element 10. For example, the exposed parts 13b are preferably arranged in three or more columns in the first direction. Further, the exposed parts 13b are preferably arranged in a plurality of rows also in a second direction being perpendicular to the first direction. For example, the exposed parts 13b are preferably arranged in several rows to several tens of rows in the second direction. The exposed parts 13b are preferably arranged in a matrix in the first direction substantially parallel to a portion of the outer periphery of the semiconductor layered body 13, and in the second direction substantially perpendicular to the first direction. Such an arrangement allows the first external connecting parts, which is described below, to be arranged between the columns and rows of the exposed parts arranged in the first direction and the second direction while being spaced apart from each other.

The number of the exposed parts 13b arranged in the first direction is preferably at least two, and more preferably, at least three, at least five, or at least seven. While the number of the exposed parts 13b arranged in the second direction may be smaller or greater than the number of the exposed parts 13b arranged in the first direction, the number of the exposed parts 13b arranged in the second direction is preferably smaller. In other words, the number of columns in the second direction of the exposed parts 13b arranged in columns is preferably smaller than the number of the exposed parts 13b arranged in one column.

The plurality of exposed parts 13b may all be substantially identical to each other, different from each other, or partially different from each other in shape and size as seen in a plan view. Because the exposed parts 13b are each a region including no light emitting layer, regularly arranging the plurality of exposed parts in similar size can alleviate unevenness in light emitting area and current supply amount. As a result, such an arrangement can alleviate luminance non-uniformity over the entire light emitting element.

Preferably, a plurality of exposed parts 13b is formed inner than the outer edge of the semiconductor layered body 13. Preferably, the total area of the exposed parts 13b arranged inner than the outer edge of the semiconductor layered body 13 occupies 30% or less, 25% or less, 20% or less, 18% or less, and 15% or less of the plane area of the semiconductor layered body 13. Such ranges can bring the current supply to the first semiconductor layer 13n and the second semiconductor layer 13p into balance, and alleviate luminance non-uniformity due to uneven power supply.

In particular, the exposed parts 13b are each substantially circular as seen in a plan view. The exposed parts 13b each have a diameter in a range of several tens of micrometers to several hundred micrometers. Preferably, the exposed parts 13b are arranged at a constant interval on the upper surface side, for example, at an interval 1.5 times to 5 times as great as the diameter of each exposed part 13b.

The semiconductor layered body 13 may be selected from various types of semiconductors, such as a Group III-V compound semiconductor and a Group II-VI compound semiconductor. Specifically, the semiconductor layered body 13 may be a nitride-based semiconductor material such as $In_XAl_YGa_{1-X-Y}N$ ($0 \leq X$, $0 \leq Y$, $X+Y \leq 1$), such as InN, AlN, GaN, InGaN, AlGaN, or InGaAlN. The thickness and layer structure of each layer may be one of those known in the art.

Insulating Film 14

The insulating film 14 covers the upper surface and the lateral surface of the semiconductor layered body 13. The insulating film 14 is provided with at least one opening 14a above each exposed part 13b and at least one opening 14b above the second semiconductor layer 13p. By virtue of the insulating film 14 covering the semiconductor layered body 13 and provided with the opening 14a above each exposed part 13b, the first electrode 11 can be formed over a wide area in the upper surface of the insulating film 14 covering the upper surface of the second semiconductor layer 13p.

The insulating film 14 is preferably formed by a material known in the art and by a thickness with which electrical insulation can be ensured. Specifically, the insulating film 14 may be composed of a metal oxide or a metal nitride, for example, at least one type of oxide or nitride selected from the group consisting of Si, Ti, Zr, Nb, Ta, and Al. The insulating film is only required have a thickness with which insulation is ensured.

First Electrode 11 and Second Electrode 12

The first electrode 11 and the second electrode 12 are arranged on the upper surface side of the semiconductor layered body 13 (that is, on the side opposite to the supporting substrate; on the second semiconductor layer side).

The first electrode 11 is connected to the exposed parts 13b at the openings 14a of the insulating film 14 on or above the exposed parts 13b. In this case, the first electrode 11 is preferably connected so as to cover the plurality of exposed parts 13b. More preferably, all the exposed parts 13b are covered with the first electrode 11 and collectively connected. Accordingly, the first electrode is arranged not only on the first semiconductor layer 13n but also above the second semiconductor layer 13p. That is, the first electrode 11 is arranged at the lateral surface (that is, the lateral surface of the light emitting layer 13a and lateral surface of the second semiconductor layer 13p) of the holes forming the exposed parts 13b and on the second semiconductor layer 13p via the insulating film 14.

The second electrode 12 is arranged above the second semiconductor layer 13p through the opening 14b of the insulating film 14 above the second semiconductor layer 13p, and connected to the second semiconductor layer 13p.

The first electrode 11 and the second electrode 12 may not respectively be in direct contact with the first semiconductor layer 13n and the second semiconductor layer 13p, but may be electrically connected via a conductive member such as a light-reflective electrode which is described below.

The first electrode 11 and the second electrode 12 may be formed by, for example, a single-layer film or a multilayer film of metal such as Au, Pt, Pd, Rh, Ni, W, Mo, Cr, Ti, Al, or Cu, or alloy of the foregoing metals. Specifically, the first electrode 11 and the second electrode 12 may be formed by a multilayer film of, in sequence from the semiconductor layer side, Ti/Rh/Au, Ti/Pt/Au, W/Pt/Au,Rh/Pt/Au, Ni/Pt/Au, Al—Cu alloy/Ti/Pt/Au, Al—Si—Cu alloy/Ti/Pt/Au, or Ti/Rh. The thickness may be any of those used in the art.

When the shape of the semiconductor layered body as seen in a plan view is quadrangular, the shape of the outer edge of the first electrode 11 and the second electrode 12 as seen in a plan view is also preferably quadrangular or substantially quadrangular. The first electrode 11 and the second electrode 12 are alternately arranged so as to be parallel to each other in one direction in one semiconductor layered body as seen in a plan view. For example, preferably, the first electrode 11 and the second electrode 12 are arranged so that the first electrode is arranged on each of the opposite sides of the second electrode as seen in a plan view.

Light-Reflective Electrode

The light emitting element 10 preferably includes a light-reflective electrode 16 interposed between the first electrode and/or the second electrode and the second semiconductor layer.

The light-reflective electrode 16 may be composed of silver, aluminum, or alloy of which main component is one of silver and aluminum. In particular, silver or silver alloy is more preferable for their high light reflectivity to light emitted from the light emitting layer. The light-reflective electrode 16 preferably has a thickness with which light emitted from the light emitting layer is effectively reflected. For example, the thickness may be in a range of about 20 nm to 1 μm inclusive. A contact area with larger in size between the light-reflective electrode and the second semiconductor layer is more preferable. Accordingly, the light-reflective electrode 16 is preferably disposed also between the first electrode 11 and the second semiconductor layer 13p. Specifically, the total plane area of the light-reflective electrode 16 may occupy 50% or more, 60% or more, 70% or more of the plane area of the semiconductor layered body.

In the case where the light-reflective electrode 16 contains silver, in order to prevent migration of silver, a protective layer 17 that covers the upper surface, preferably the upper surface and the lateral surface of the light-reflective electrode 16 may be provided. The protective layer 17 may be formed by a conductive member such as metal or alloy that is normally used as a material of electrodes, or may be formed by an insulating member. The conductive member may be a single layer or a multilayer containing metal such as aluminum, copper, or nickel. The insulating member may be the same as or a similar to the material the above-described insulating film 14. Among such materials, SiN is preferably used. SiN is good as a material for alleviating intrusion of moisture for its high density. In order to effectively prevent or alleviate silver migration, the thickness of the protective layer 17 may be in a range of about several hundred nanometers to several micrometers. In the case where the protective layer 17 is formed by an insulating member, by the protective layer 17 with an opening above the light-reflective electrode, the light-reflective electrode and the second electrode can be electrically connected to each other. In the case where the light emitting element 10 includes the light-reflective electrode 16 and the protective layer 17 on the second semiconductor layer 13p, the insulating film 14 covering the semiconductor layered body 13 covers the light-reflective electrode 16 and the protective layer 17, and is provided with an opening immediately under the second electrode 12. Thus, the second electrode 12 and the light-reflective electrode 16 are electrically connected to each other.

First External Connecting Parts and Second External Connecting Parts

The first external connecting parts 21 and the second external connecting parts 22 are provided for establishing external connection.

The first external connecting parts 21 are provided, above the second semiconductor layer 13p, on the first electrode 11 provided at upper surface of the insulating film 14, and connected to the first electrode 11.

The number of the first external connecting parts 21 is two or more and each pieces thereof has a fragmented shape. As seen in a plan view, the plurality of first external connecting parts 21 surrounds one exposed part 13b while being spaced apart from the exposed part 13b. Further, a group of first external connecting parts 21 and other group of first external connecting parts 21 respectively surrounding adjacent exposed parts 13b are spaced apart from each other.

The number of the first external connecting parts may be appropriately selected according to the number of the exposed part formed at the semiconductor layered body. For example, one or more first external connecting parts for one exposed part will suffice, and may be, for example, three or four. It is not necessarily for every exposed part to be surrounded by the first external connecting parts in the same manner. The number and/or shape of the first external connecting parts surrounding one exposed part 13b may be different for different position of the exposed part 13b. For example, the number and/or shape of the first external connecting parts may differ among the position opposing to the outer edge of the semiconductor layered body and/or the position opposing to the second electrode and/or the position inner than the semiconductor layered body surrounded by the exposed parts. In other words, so long as the first external connecting parts 21 include those arranged as the above-described manner, in particular, those arranged regularly, the first external connecting parts 21 may include those arranged irregularly.

The fragmented shape of the first external connecting part may be any of various shapes, for example, a polygonal shape such as a triangular shape or a quadrangular shape, a sector shape, a semicircular shape, a circular shape, an oval shape, an annular shape, a circular annular shape, an annular sector, any of these shapes being partially removed, or any combination of these shapes. Among such shapes, what is preferable is the shape such as an annular sector, which is a shape obtained by dividing a circular annular shape in a radial direction into an desired size. In this case, overlaying the center of the circular annular shape on the center of the exposed part can diffuse heat generated at the exposed part. Hence, a light emitting element exhibiting even better heat dissipation property is obtained. For example, the plane area of one fragmented shape may be in a range of about 2000 $\mu m^2$ to 5000 $\mu m^2$ inclusive.

The interval between the first external connecting parts surrounding one exposed part and the exposed part may be in a range of 12 μm to 28 μm inclusive. In this manner, by the exposed part and the first external connecting parts being arranged in close proximity to each other, heat generated at the light emitting layer exposed at the lateral surface of the hole forming the exposed part 13b (that is, the contact part between the first semiconductor layer 13n and the second semiconductor layer 13p where the amount of heat generated by the light emitting element emitting light is great) can be efficiently dissipated. Further, because the exposed part and the first external connecting parts do not overlap each other as seen in a plan view, damage exerted on the semiconductor layered body around the exposed part may be avoided or alleviated.

A group of fragmented shaped first external connecting parts 21 surrounding one exposed part is spaced apart from other group of plurality of fragmented shaped first external connecting parts 21 surrounding the adjacent exposed part. That is, between adjacent exposed parts, a plurality of first external connecting parts is arranged. Between adjacent exposed parts, the first external connecting parts 21 are preferably spaced apart by a distance of, for example, 3 µm or more, and more preferably, a distance of 20 µm or more. Setting such a distance allows the uncured resin material forming the covering member to flow without generating voids between the first external connecting parts. Thus, the light emitting element is effectively prevented or discouraged from being removed attributed to the thermal expansion of air existing between the light emitting element and the substrate.

The total plane area of the first external connecting parts 21 in the light emitting element 10 can be appropriately set according to the size of the semiconductor layered body, the number and size of the exposed parts and the like. For example, the total plane area of the first external connecting parts should occupy 40% or more, more preferably 70% or more, of the plane area of the semiconductor layered body 13. Further, the total plane area of the first external connecting parts should occupy 60% or less, more preferably 50% or less, of the plane area of the semiconductor layered body 13. Such a range can reduce the manufacturing costs, in the case where the material of the first external connecting parts 21 is an expensive metal, while securing the heat dissipation property, for example. Further, such a range can alleviate the stress applied on the electrode, the insulating film, the semiconductor layered body and the like attributed to the coverage of the large area by the first external connecting parts 21.

The second external connecting parts 22 are electrically connected to the second electrode. The second external connecting parts 22 may each have any of various shapes as seen in a plan view, for example, a polygonal shape such as a triangular shape, a quadrangular shape, a sector shape, a semicircular shape, a circular shape, an oval shape, an annular shape, an annular sector, any of these shapes being partially removed, or any combination of these shapes.

For example, the shape of each second external connecting part 22 may be a shape elongated in the first direction, and being slightly shorter in the first direction than the second electrode and the semiconductor layered body. For example, the length of each second external connecting part 22 in the first direction may be ⅟₁₅ to ⅓ as great as, preferably ⅟₁₀ to ⅕ as great as, the length of one side of the semiconductor layered body. Further, each second external connecting part 22 may have a shape such as a polygonal shape (for example, quadrangular shape), a circular shape, an oval shape or the like regularly or irregularly arranged in the first direction. The second external connecting parts 22 may be arranged in regular intervals or irregular intervals. The second external connecting parts 22 may be different in shape and/or size depending on sites where the second external connecting parts 22 are arranged. For example, the shape of one second external connecting part 22 at the portion near to the outer edge of the semiconductor layered body may be a narrow or wide quadrangle, a small or large circle, or the like, and other second external connecting part 22 at the central portion may be a narrow or wide quadrangle, a small or large circle, or the like. In such a case, the size of each second external connecting part 22 may be in a range of 80% to 500%, or in a range of 80% to 150% of the size of each first external connecting part 21.

Among such ranges, it is preferable to set the area ratio of the first external connecting parts 21 to the second external connecting parts 22 close to each other (for example, 1:0.8 to 1:1.5). Accordingly, when flip-chip mounting the light emitting element to the substrate, stress on the light emitting element is less likely to be unevenly applied, thereby enabling stable connection between the light emitting element and the substrate. Specifically, such stable connection can be exhibited in the case where the size of the second external connecting parts 22 is equal or substantially equal to the sizes of the first external connecting parts 21 (for example, in a range of about 1:0.9 to about 1:1). Besides, such ranges can contribute to well flowability of the uncured resin material for forming the covering member, which is described below.

The second external connecting parts 22 are preferably interposed between a plurality of first external connecting parts and a plurality of exposed parts so as to divide the plurality of first external connecting parts into the two regions, for example, in the first direction. That is, as seen in a plan view, the second external connecting parts are preferably arranged in the first direction, and the plurality of first external connecting parts 21 is arranged having the second external connecting parts 22 interposed between them. In this case, more preferably, the plurality of first external connecting parts 21 is arranged line-symmetric relative to the center line in the first direction in the region where the second external connecting parts 22 are arranged. This can alleviate unevenness of the stress applied to the first external connecting parts 21 and the second external connecting parts 22 in flip-chip mounting the light emitting element 10 on the substrate 23. Thus, the bonding precision stabilizes. Further, this can also contributes to the flowability of the uncured resin material for forming the covering member which is described below. Thus, thermal stress can be reduced.

The first external connecting parts 21 and the second external connecting parts 22 can be formed by methods known in the art, for example, plating, sputtering, vapor deposition or the like.

In the case where the first external connecting parts 21 and the second external connecting parts 22 are formed by plating, a single-layer or multilayer structure of Al, Ag, Al alloy, Ag alloy, Cu, Au, or Ni may be employed. In order to attain anti-corrosion property and improve bondability to the substrate 23, at least the uppermost layer of the first external connecting parts 21 and the second external connecting parts 22 is formed a material comprising Au as the main component.

The thickness of the first external connecting parts 21 and the thickness of the second external connecting parts 22 can be adjusted as appropriate according to the size, characteristic and the like of the light emitting element, and may be in a range of, for example, 1 µm to 100 µm inclusive.

Light Emitting Device

Figure 2A:
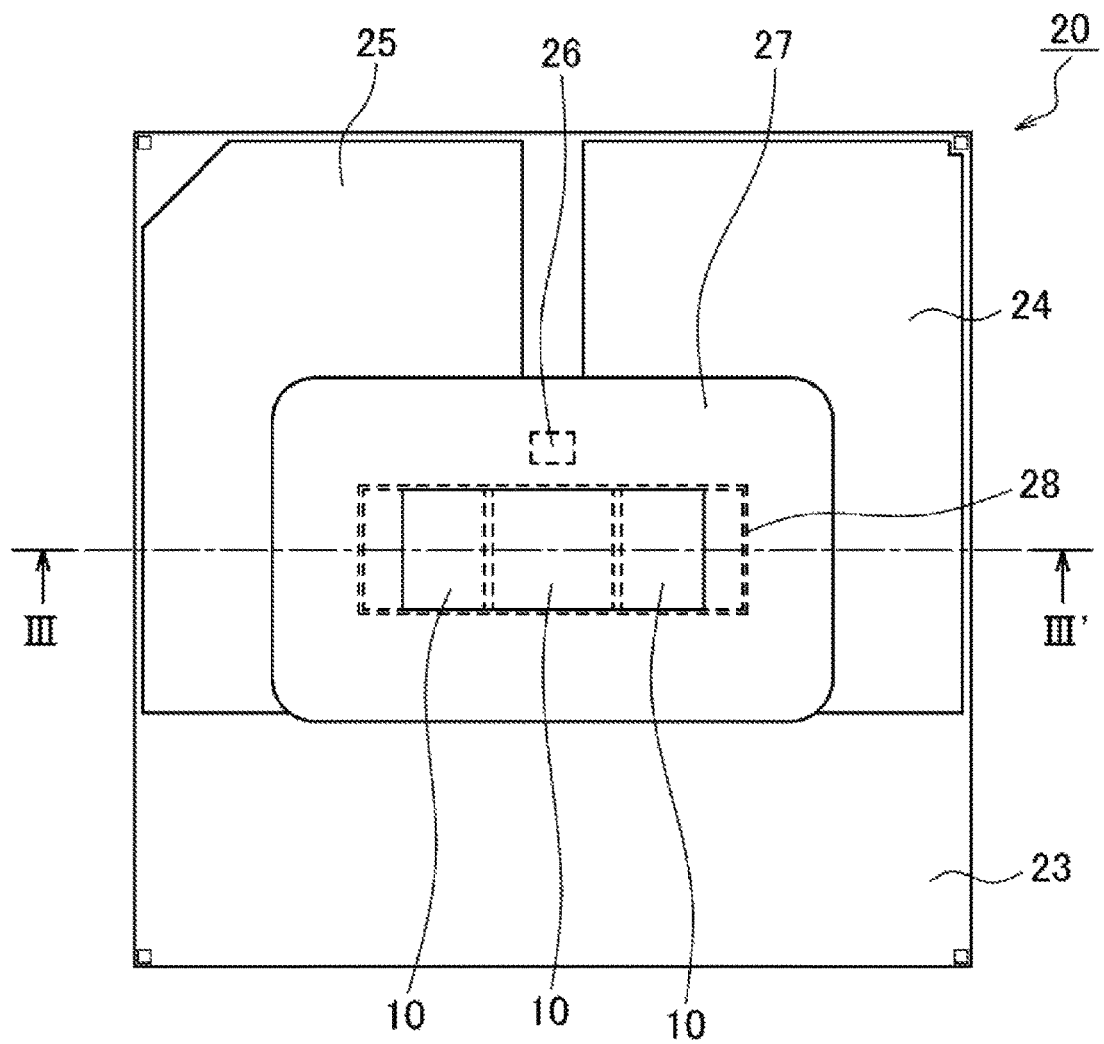
FIG. 2A is a plan view schematically showing a light emitting device according to a second embodiment of the present disclosure.
Figure 2B:
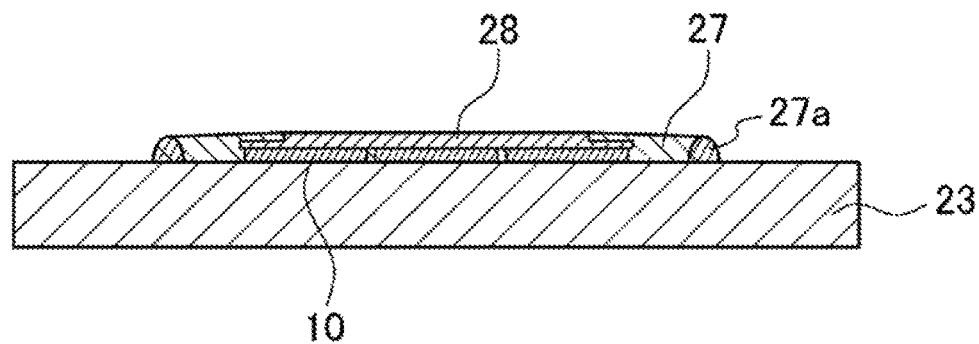
FIG. 2B is a cross-sectional view taken along line III-III' in FIG. 2A.

As shown in FIGS. 2A and 2B, the light emitting device 20 according to certain embodiment of the present disclosure includes the substrate 23 provided with wiring patterns 24, 25 at its upper surface, one or more of the above-described light emitting elements 10, a covering member 27, and a light-transmissive member 28.

Substrate

The substrate 23 is provided with wiring patterns 24, 25 at its upper surface, and the at least one light emitting element 10 is flip-chip mounted on the wiring patterns 24, 25.

The material of the substrate is, for example, an insulating member such as glass epoxy, resin, ceramic or the like, or a metal member provided with an insulating member at its surface. Among such examples, the material of the substrate is preferably ceramic which is highly heat resistant and weather resistant. The ceramic material may be alumina, aluminum nitride or the like.

The wiring patterns 24, 25 are only required to be capable of supplying current to the light emitting element, and can be formed by a material, a thickness, and a shape normally used in the art. Specifically, the wiring patterns 24, 25 can be formed by metal such as copper, aluminum, gold, silver, platinum, titanium, tungsten, palladium, iron, nickel or the like, or alloy containing the foregoing metals. In particular, the wiring patterns formed at the upper surface of the substrate have their outermost surface covered with a material exhibiting good reflectivity such as silver or gold, so that light from the light emitting element 10 is efficiently extracted. The wiring patterns are formed by electrolytic plating, electroless plating, vapor deposition, sputtering or the like. For example, in the case where the outermost surface of the first external connecting parts 21 and the second external connecting parts 22 connected to the wiring patterns as the electrodes of the light emitting element 10 is formed of a material mainly containing gold, preferably the outermost surface of the wiring patterns is also composed of a material mainly containing Au. This structure can improve the bondability between the light emitting element 10 and the substrate 23.

The wiring patterns 24, 25 preferably have positive and negative patterns at the upper surface of the substrate 23. Such wiring patterns allow the light emitting element 10 to be flip-chip mounted. When the light emitting element 10 is flip-chip mounted on the substrate 23 using the surface where the first external connecting parts 21 and the second external connecting parts 22 are formed as the lower surface, the upper surface opposite to the lower surface serves as the main light extraction surface of the light emitting element 10. The wiring patterns 24, 25 may be arranged not only at the upper surface of the substrate 23, but also at its inside and/or its lower surface of the substrate 23.

The first external connecting parts 21 and the second external connecting parts 22 in the light emitting element 10 and the wiring patterns 24, 25 may be bonded to each other by, for example, ultrasonic bonding. In this case, heat and/or pressure may be applied. Further, the bonding member may be formed of: bumps of a material mainly containing gold, silver, or copper; metal paste containing metal powder of silver, gold, copper, platinum, aluminum, or palladium and a resin binder; tin-bismuth-based solder, tin-copper-based solder, tin-silver-based solder, or gold-tin-based solder; or a brazing material such as low melting point metal.

Covering Member

The covering member 27 covers the lateral surface of the light emitting element 10, between the light emitting element 10 and the substrate 23, the upper surface of the substrate 23, and the lateral surface of the first external connecting parts 21 and the second external connecting parts 22. Further, the covering member 27 also covers those portions between the light emitting element 10 and the substrate 23 and between the fragmented first external connecting parts. The covering member is preferably disposed also immediately below the exposed parts at the lower surface of the light emitting element. Further, as is described below, in the case where the light emitting device 20 includes the light-transmissive member 28 at the upper surface of the light emitting element, the covering member 27 preferably also covers the lateral surfaces of the light-transmissive member 28.

The covering member 27 may be disposed inward of a frame body 27a formed on the substrate 23 as seen in a plan view. The frame body 27a is preferably disposed so as to surround the light emitting element 10 while being spaced apart from the light emitting element 10 as seen in a plan view. Such a frame body 27a can define the shape of the covering member 27. The frame body 27a may be formed of the material identical to or different from that of the covering member 27.

The covering member 27 and the frame body 27a may be formed of a resin comprising light-reflective, light transmissive, or light shielding resin, or any of those resins containing a light-reflective substance, a fluorescent material, a light-diffusing member, a coloring agent and the like. Among such materials, the covering member is preferably light reflective and/or light shielding. The resin structuring the covering member, the light-reflective substance and the like may be materials normally used in the art. Examples of the resin material include a resin or hybrid resin including at least one of silicone resin, modified silicone resin, epoxy resin, modified epoxy resin, and acrylic resin. The light-reflective substance may be titanium oxide, silicon oxide, zirconium oxide, potassium titanate, alumina, aluminum nitride, boron nitride, or mullite.

The material of the covering member 27 preferably contains resin that exhibits high flowability and cures by being heated or irradiated with light, in view of easier entry thereof between the light emitting element 10 and the substrate 23, particularly between the first external connecting parts 21, and easier prevention or alleviation of occurrence of voids. Such a material may exhibit flowability at, for example, the viscosity in a range of 0.5 Pa·s to 30 Pa·s inclusive. Further, according to the content of the light-reflective substance in the material of the covering member 27 and the like, the amount of reflected light, the amount of transmitted light and the like can be changed. The covering member 27 preferably contains the light-reflective substance by, for example, 20 wt % or more.

The covering member 27 and the frame body 27a can be molded by, for example, injection molding, potting molding, resin printing, transfer molding, compression molding or the like.

Light-Transmissive Member

The light emitting device 20 preferably includes the light-transmissive member 28 at the upper surface of the light emitting element 10. The light-transmissive member 28 is a member that covers the light extraction surface of the light emitting element, and is capable of transmitting light emitted from the light emitting element by 50% or more, 60% or more, preferably 70% or more, to be released to the outside. The light-transmissive member may contain a fluorescent material capable of converting the wavelength of at least part of light reflected by the light diffusing member and at least part of light emitted from the light emitting element 10. The lower surface outer edge of the light-transmissive member 28 preferably coincides with the upper surface outer edge of the light emitting element in a top view, or positioned either inward or outward of the inner side and the outer side of the upper outer edge of the light emitting element. The light-transmissive member 28 preferably has a plate-like shape, and has the thickness in a range of, for example, 50 µm to 300 µm. The light-transmissive member 28 preferably has its outer periphery on the upper surface entirely or partially notched. This can reduce the area of the upper surface of the light-transmissive member 28 than that of the lower surface and, therefore, light can be extracted via the light-transmissive member 28 by a smaller area.

The light-transmissive member may be formed of, for example, resin, glass, an inorganic substance or the like. Further, the light-transmissive member containing the fluorescent material may be, for example, a sintered body of a fluorescent material, or resin, glass, or other inorganic substance containing a fluorescent material. Further, the light-transmissive member may be a flat plate-like molded body of resin, glass, or an inorganic substance on which surface a resin layer containing a fluorescent material is formed. As the transparency of the light-transmissive member is higher, light is more easily reflected at the interface between the light-transmissive member and the covering member, that is, luminance improves.

The fluorescent material contained in the light-transmissive member may be, for example, in the case where the light emitting element 10 is a blue-color light emitting element or an ultraviolet light emitting element, a cerium-activated yttrium-aluminum-garnet-based fluorescent material (YAG:Ce), a cerium-activated lutetium-aluminum-garnet-based fluorescent material (LAG:Ce), a europium and/or chromium-activated nitrogen-containing calcium aluminosilicate-based fluorescent material ($CaO-Al_2O_3-SiO_2$:Eu), a europium-activated silicate-based fluorescent material (e.g., $(Sr,Ba)_2SiO_4$:Eu), a nitride-based fluorescent material such as a β-SiAlON-based fluorescent material (e.g., $Si_{6-z}Al_zO_zN_{8-z}$:Eu (0<Z<4.2)), a CASN-based fluorescent material, and an SCASN-based fluorescent material, a KSF-based fluorescent material ($K_2SiF_6$:Mn), a sulfide-based fluorescent material, a quantum dot fluorescent material or the like. A combination of any of the foregoing fluorescent materials and a blue-color light emitting element or a ultraviolet light emitting element can provide a light emitting device emitting light emitting desired color (for example, a whitish-color light emitting device). When such a fluorescent material is contained in the light-transmissive member, the content of the fluorescent material is preferably in a range of, for example, about 5 wt % to 50 wt % inclusive.

The light-transmissive member is bonded so as to cover the light extraction surface of the light emitting element. The light-transmissive member and the light emitting element may be bonded to each other with or without an adhesive agent interposing therebetween. The adhesive agent may be, for example, a light-transmissive resin material such as epoxy or silicone. The light-transmissive member and the light emitting element may be bonded to each other by direct bonding method such as compression bonding, sintering, surface activated bonding, atomic diffusion bonding, or hydroxyl group bonding.

The light emitting device 20 may arbitrarily include other element or an electronic component such as a protective element 26. Such an electronic component is preferably embedded in the covering member 27.

First Embodiment

As shown in FIGS. 1A to 1C, the light emitting element 10 according to the first embodiment includes the semiconductor layered body 13, the insulating film 14, the first electrode 11, the second electrode 12, the first external connecting parts 21, and the second external connecting parts 22.

On the supporting substrate 15 formed of sapphire and having surface irregularity at its surface, the semiconductor layered body 13 is structured by the first semiconductor layer 13n, the light emitting layer 13a, and the second semiconductor layer 13p being layered in sequence. The shape of the semiconductor layered body 13 as seen in a plan view is substantially square, of which sides each measure about 1.0 mm.

On the surface of the semiconductor layered body 13 on the second semiconductor layer 13p side, a plurality of exposed parts 13b where the first semiconductor layer 13n is exposed outside the second semiconductor layer 13p and the light emitting layer 13a is formed. The exposed parts 13b are arranged in a matrix as seen in a plan view. Specifically, the exposed parts 13b are arranged in columns (i.e., in the first direction) by eight pieces in each column. Further, the exposed parts 13b are arranged in rows in the second direction being perpendicular to the first direction by four pieces in each row. The rows are grouped into two groups respectively on both sides of the semiconductor layered body by the boundary of the second electrodes 12. The exposed parts 13b each have a circular shape of which diameter is about 13 µm as seen in a plan view, and the center-to-center distance of the adjacent circles is about 170 µm in each of the first direction and the second direction.

The semiconductor layered body 13 is covered with the insulating film 14 formed of $SiO_2$. The insulating film 14 is provided with openings 14a, 14b at least on or above the plurality of exposed parts 13b and above the site of the second semiconductor layer connected to the second electrode 12, respectively.

Between the second semiconductor layer 13p and the first electrode and/or the second electrode, the light-reflective electrode 16 formed of silver is disposed substantially over the entire surface. The light-reflective electrode 16 has its upper surface and its lateral surfaces covered with the protective layer 17.

The light emitting element 10 includes the second electrode 12 connecting to the second semiconductor layer 13p via the light-reflective electrode 16 on the upper surface side of the semiconductor layered body 13. The second electrode 12 is formed at substantially the center of the light emitting element 10 as seen in a plan view, to have an elongated shape in the first direction measuring about 860 µm×140 µm as seen in a plan view.

The light emitting element 10 includes the first electrode 11 formed on each of the opposite sides of the second electrode 12 in the second direction as seen in a plan view. The first electrode 11 is connected to the exposed part 13b at the opening 14a of the insulating film 14. The first electrode 11 is also formed on the second semiconductor layer 13p via the insulating film 14.

On the second electrode 12, the second external connecting parts 22 each having a circular shape with a diameter slightly smaller than the width of the second electrode 12 are connected to the second electrode 12 in a line in the first direction. The diameter of each second external connecting part 22 is about 130 µm.

On both sides interposing the second external connecting parts 22 arranged in a column, a plurality of first external connecting parts 21 is formed.

The planar shape of each first external connecting part 21 is a fragmented shape which is an annular sector corresponding to a substantially quarter of an annular circle (i.e., a circular ring shape). The plane area of each first external connecting part 21 is about 2000 µm². For one exposed part 13b, four first external connecting parts 21 are arranged to surround the exposed part 13b so as to be in close proximity to the exposed part 13b while being spaced apart from the exposed part 13b. A distance D1 between the first external connecting parts 21 is in a range of about 3 µm to about 20 µm.

A group of first external connecting parts 21 and other group of first external connecting parts 21 respectively surrounding adjacent exposed parts 13b are spaced apart from each other. The distance of the spacing is, for example, a distance D2 in the first direction and a distance D3 in the second direction, each in a range of about 3 µm to about 20 µm.

The thickness of the first external connecting parts 21 and the second external connecting part 22 is in a range of about 10 µm to about 20 µm.

In such a light emitting element 10, a plurality of first external connecting parts 21 each having a fragmented shape is arranged, to surround one exposed part. Further, the first external connecting parts are spaced from the exposed part. A group of first external connecting parts and other group of first external connecting parts respectively surrounding adjacent exposed parts are spaced apart from each other. Thus, at the first semiconductor layer 13n where the amount of heat generated by the light emitting element emitting light is great, that is, at the contact part with the n-type semiconductor layer, heat is efficiently dissipated. Further, in mounting the light emitting element on the substrate, damage exerted on the semiconductor layered body around the exposed part can be reduced. Still further, the uncured resin material forming the covering member is allowed to flow without generation of voids between first external connecting parts. Thus, the light extraction efficiency of the light emitting device can be improved, and the light emitting element is prevented or alleviated from being removed attributed to the thermal expansion of air which would be present if voids were present between the first external connecting parts. As a result, a high-quality light emitting device exhibiting high light extraction efficiency can be provided.

Second Embodiment

As shown in FIGS. 2A and 2B, a light emitting device 20 according to a second embodiment includes the substrate 23 having a wiring pattern at its upper surface, the above-described light emitting elements 10, the covering member 27, and the light-transmissive member 28.

The substrate 23 is formed of aluminum nitride, and includes positive and negative wiring patterns 24, 25 at its upper surface. The outermost surface of the wiring patterns 24, 25 is formed of Au. On the substrate 23, the light emitting elements 10 are flip-chip mounted using the surface where the first external connecting parts 21 and the second external connecting parts 22 are formed as the mounting surface.

YAG ceramic containing a YAG fluorescent material by about 15 w % is fixed on or above the upper surface of the light emitting element 10 by a light-transmissive silicone resin adhesive agent. The YAG ceramic containing a YAG fluorescent material is provided to serve as the light-transmissive member 28. The thickness of the light-transmissive member 28 is about 180 µm. The outer edge of the lower surface of the light-transmissive member 28 is positioned so as to substantially coincide with or slightly outer than the outer edge of the light emitting element 10, as seen in a plan view. The outer edge of the upper surface of the light-transmissive member 28 is smaller than the outer edge of the lower surface. The each of corners between the lateral surfaces of the light-transmissive member 28 has a rounded shape in the entire outer edge of the upper surface. As seen in a plan view, the outer edge of the upper surface of the light-transmissive member 28 is positioned slightly inward of the outer edge of the lower surface of the light-transmissive member 28. As seen in a plan view, the distance between the outer edge of the lower surface and the outer edge of the upper surface is in a range of about 50 µm to about 75 µm.

In the periphery of the light emitting element 10, the protective element 26 is disposed. The protective element 26 is, for example, a Zener diode.

The lateral surfaces of the light emitting element 10 and the portion between the light emitting element 10 and the substrate 23 are covered with the covering member 27. The covering member 27 further covers all of the upper surface of the substrate 23, the lateral surfaces of the first external connecting parts 21 and the second external connecting parts 22. The protective element 26 is embedded inside the covering member 27. Further, the covering member exposes the upper surface of the light-transmissive member 28 outside and covers the lateral surfaces of the light-transmissive member 28. The covering member 27 is provided inward of the frame body 27a.

The covering member 27 and the frame body 27a are formed of modified silicone resin containing titanium oxide by about 30 wt %, and is light reflective.

In the light emitting device having such a structure, the light emitting element itself is capable of efficiently preventing or alleviating breakage of the electrode and the like attributed to stress load in mounting exerted on or around the exposed part, while ensuring the heat dissipation. Accordingly, a high-quality light emitting device exhibiting high light extraction efficiency can be obtained.

It will be apparent from the present disclosure that the light emitting device may include any of the light emitting elements according to the third to seventh embodiments described below instead of the light emitting element 10 of the first embodiment.

Third Embodiment

Figure 3:
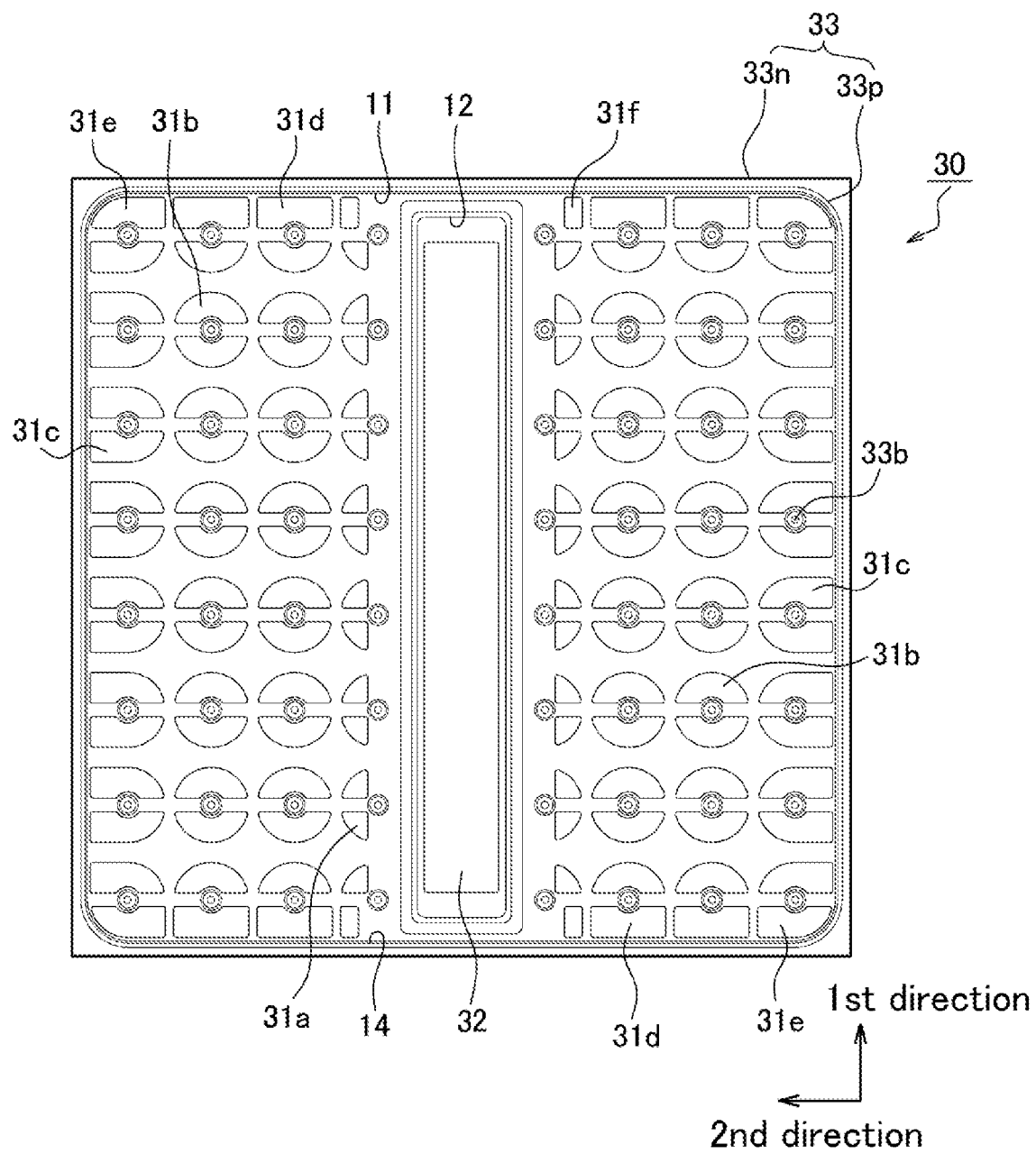
FIG. 3 is a plan view schematically showing a light emitting element according to a third embodiment of the present disclosure.

As shown in FIG. 3, a light emitting element 30 according to a third embodiment is structured substantially the same as the light emitting element 10 except for the number and shapes of first external connecting parts 31a, 31b, 31c, 31d, 31f surrounding each exposed part 33b and the shape of a second external connecting part 32.

That is, the second external connecting part 32 having a band-like shape extending in the first direction is arranged in the second electrode 12 disposed on a semiconductor layered body 33 in which a first semiconductor layer 33n, a light emitting layer, and a second semiconductor layer 33p are layered in sequence.

The light emitting element 30 includes a plurality of exposed parts 33b, and one exposed part 33b is surrounded by two of the first external connecting parts 31a to 31f.

Among the exposed parts 33b regularly arranged in the first direction and the second direction, as to the exposed parts 33b arranged adjacent to the second electrode 12, no first external connecting part is disposed between such exposed parts 33b and the second electrode 12. On the side opposite to the second electrode 12 with reference to such exposed parts 33b, two fragmented first external connecting parts 31a which are each an annular sector substantially a quarter of a circle as seen in a plan view are arranged for one exposed part 33b. The first external connecting parts 31a are in close proximity to the exposed part 33b while being spaced apart from the exposed part 33b.

Among the exposed parts 33b arranged in the first direction, for each of those not being adjacent to the second electrode 12 and not being adjacent to the outer edge of the semiconductor layered body 33, two fragmented first external connecting parts 31b each having an annular semicircular shape as seen in a plan view are arranged in the first direction so that one exposed part 33b is interposed therebetween. The first external connecting parts 31b are in close proximity to the exposed part 33b while being spaced apart from the exposed part 33b.

Further, for each of the exposed parts 33b adjacent to the outer edge of the semiconductor layered body 33 extending in the first direction, two first external connecting parts 31c are arranged in the first direction so that one exposed part 33b is interposed therebetween. The first external connecting parts 31c are in close proximity to the exposed part 33b while being spaced apart from the exposed part 33b. The first external connecting parts 31c is each fragmented having an annular semicircular shape as seen in a plan view, one end of the fragmented shape on the outer edge side of the semiconductor layered body 33 extending toward the outer edge side.

Between the exposed parts 33b adjacent to the outer edge of the semiconductor layered body 33 extending in the second direction and the outer edge, the first external connecting parts 31d are arranged in close proximity to the exposed parts 33b while being spaced apart from the exposed parts 33b. The first external connecting parts 31d each have a band-like fragmented shape being recessed conforming to the outer shape of the exposed part 33b. To such a first external connecting part 31d, a fragmented first external connecting part 31b having an annular semicircular shape opposes via one exposed part 33b.

The fragmented first external connecting parts 31e, 31f respectively adjacent to the corners of the semiconductor layered body 33 and the corners of the second electrodes are slightly deformed according to the size, position and the like of the exposed parts and the shape and the like of the semiconductor layered body 33. The first external connecting parts 31e, 31f may have a shape same as or similar to any of other first external connecting parts described above.

In addition to the effect that the light emitting element 10 exhibits, the light emitting element 30 can more firmly be connected to the mounting substrate or the like at the outer periphery of the light emitting element 30 by the first external connecting parts arranged along the outer periphery of the semiconductor layered body 33.

Fourth Embodiment

Figure 4A:
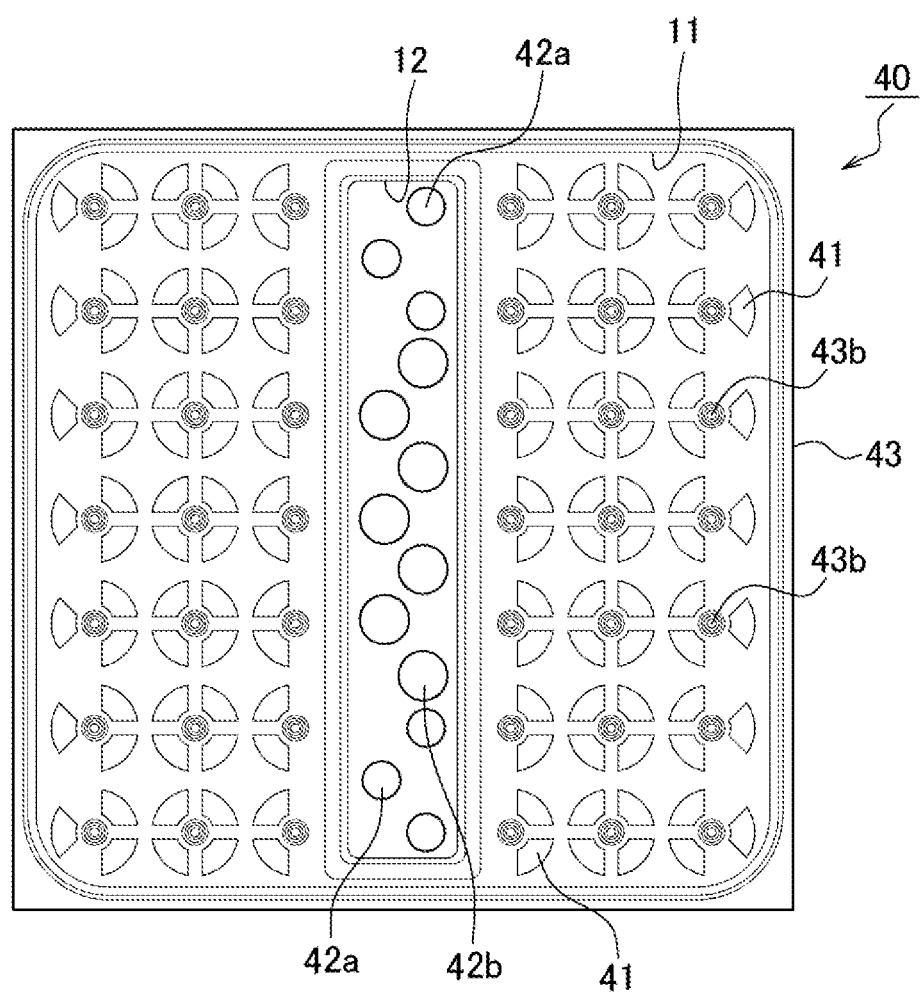
FIG. 4A is a plan view schematically showing a light emitting element according to a fourth embodiment of the present disclosure.

As shown in FIG. 4A, a light emitting element 40 according to a fourth embodiment is structured substantially the same as the light emitting element 10 except for the number of exposed parts 43b, the number and thickness of first external connecting parts 41 surrounding each exposed part 43b, and the shape and number of second external connecting parts 42a, 42b.

That is, in the semiconductor layered body 43, the exposed parts 43b are arranged in columns in the first direction by seven pieces in each column. Further, the exposed parts 43b are arranged in rows in the second direction being perpendicular to the first direction by three pieces in each row. The rows are grouped into two groups respectively on both sides of the semiconductor layered body by the boundary of the second electrodes 12. The exposed parts 13b each have a circular shape of which diameter is about 13 μm as seen in a plan view, and the center-to-center distance of the adjacent circles is about 170 μm in each of the first direction and the second direction.

On the second electrode 12, three smaller circular second external connecting parts 52a as seen in a plan view are arranged on each side of the ends in the first direction, and seven larger circular second external connecting parts 52b as seen in a plan view are arranged at the central part.

Further, among the exposed parts 43b arranged in the first direction, for the exposed parts 43b not adjacent to the outer edge of the semiconductor layered body 43, four first external connecting parts 31b each having a fragmented annular sector shape corresponding to a substantially quarter of an annular circle as seen in a plan view are arranged in the first direction and the second direction, so as to surround one exposed part 43b in close proximity to the exposed part 43b while being spaced apart from the exposed part 43b. However, between the second electrode 12 and the column of the exposed parts 43b adjacent to the second electrode 12, no fragmented first external connecting parts are arranged.

Further, for the exposed parts 43b adjacent to the outer edge of the semiconductor layered body 43 extending in the first direction, three first external connecting parts 31c each having a fragmented annular sector shape as seen in a plan view are arranged in close proximity to the exposed parts 33b in the first direction while being spaced apart from the exposed parts 33b.

The light emitting element 40 structured as described above exhibits the effect similar to that the light emitting element 10 does.

The thermal resistance was simulated using the light emitting element 40. The thermal resistance value was obtained by the transient heat measurement compliant with JESD51-14, standard of JEDEC (Joint Electron Device Engineering Council). This measurement method derives a change in the temperature from a change in the voltage, on the basis of the correlation between the junction temperature of a device such as a light emitting element and voltage.

Figure 4B:
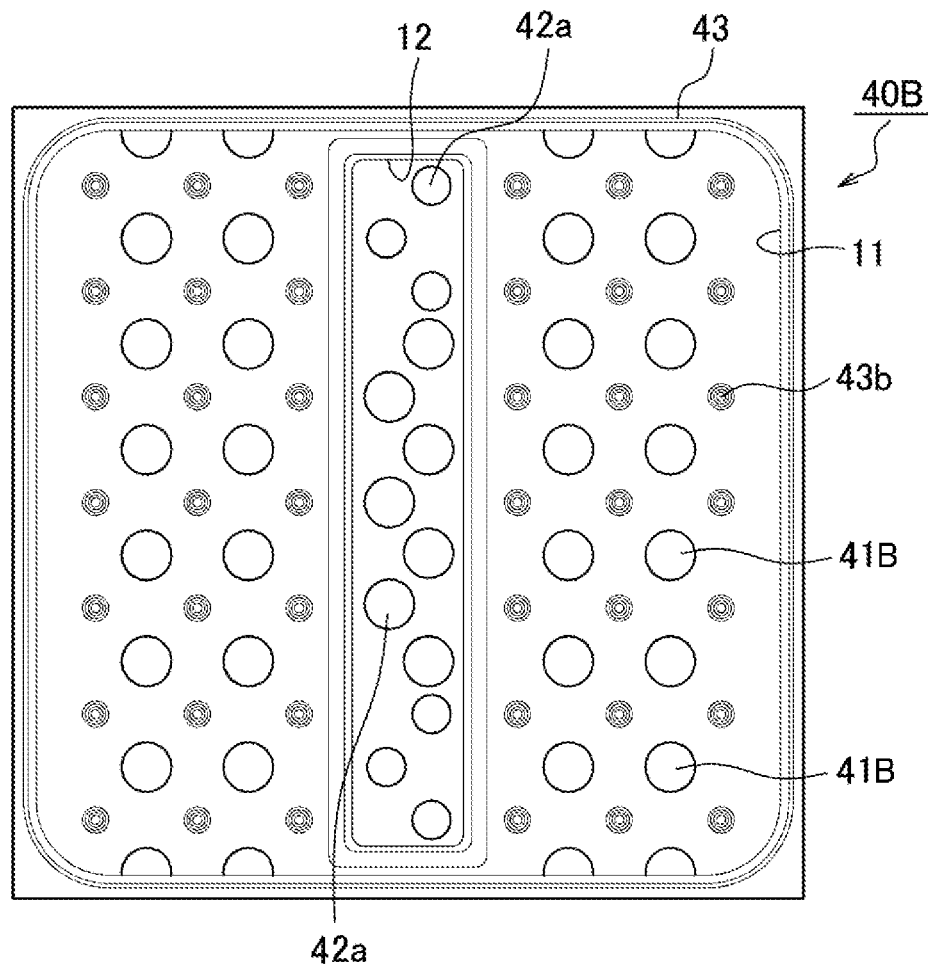
FIG. 4B is a plan view schematically showing a light emitting element for comparison with the light emitting element shown in FIG. 4A.

For the comparison purpose, as shown in FIG. 4B, a light emitting element 40B having a structure similar to the light emitting element 40 was measured by using simulation. The light emitting element 40B is substantially the same as the light emitting element 40 except that circular first external connecting parts 41B as seen in a plan view were arranged such that most of the circular first external connecting parts 41B are each surrounded by four exposed parts 43b adjacent to each other in a matrix. The total plane area of the first external connecting parts 41B was substantially equivalent to the total plane area of the first external connecting parts 41 of the light emitting element 40. Similar to the light emitting element 40, the light emitting element 40B underwent the thermal resistance measurement.

Figure 4C:
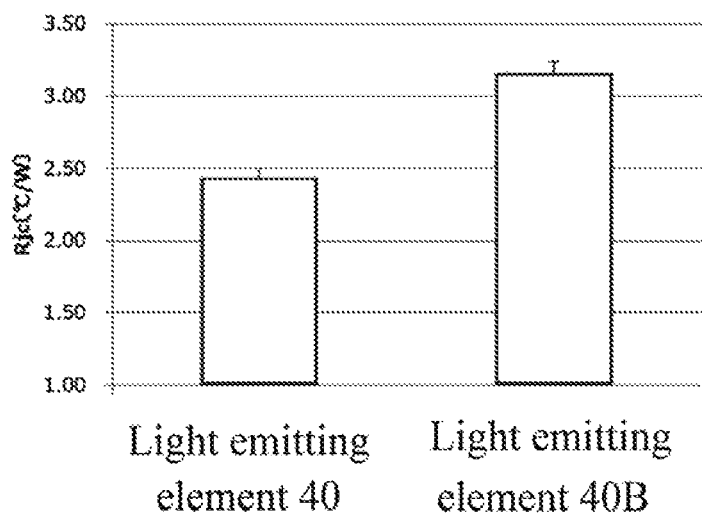
FIG. 4C is a graph showing measured values of the thermal resistance of the light emitting element shown in FIG. 4A and the light emitting element shown in FIG. 4B.

FIG. 4C shows the result of measurement and calculation by using simulation. As seen from the result in FIG. 4C, it was demonstrated that the thermal resistance of the light emitting element 40 was reduced by about 23% as compared to the thermal resistance of the light emitting element 40B. This reduction in thermal resistance value represents good heat dissipation, and contributes to providing a higher-performance light emitting device.

Fifth embodiment

Figure 5:
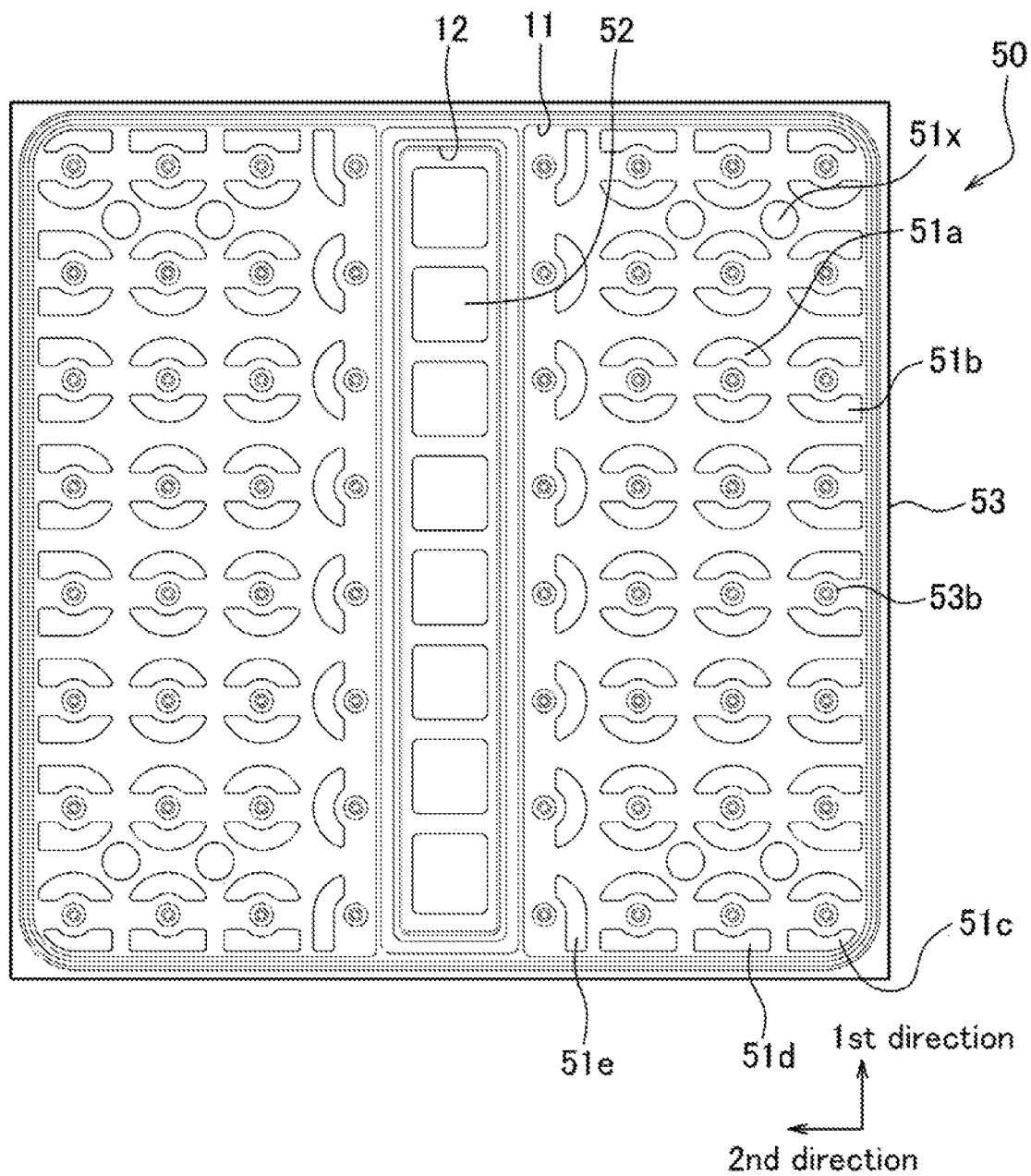
FIG. 5 is a plane view schematically showing a light emitting element according to a fifth embodiment of the present disclosure.

As shown in FIG. 5, a light emitting element 50 according to a fifth embodiment is substantially the same as the light emitting elements 10, 30, 40 except for the number and shapes of first external connecting parts 51a, 51b 51c, 51d, 51e surrounding each exposed part 53b, the number and shape of second external connecting parts 52.

In other words, the light emitting element 50 includes a first semiconductor layer 53n, and a second electrode 12 having a band-like shape extending in the first direction. The second electrode 12 is positioned on the semiconductor layered body 53 in which the first semiconductor layer 53n, a light emitting layer and a second semiconductor layer 53p are layered in this sequence. On the second electrode 12, fragmented second external connecting parts 52 are arranged in column in the first direction.

The light emitting element 50 includes a plurality of exposed parts 53b regularly arranged in the first direction and the second direction.

Among the exposed parts 53b arranged in the first direction, for each of those not being adjacent to the second electrode 12 and not being adjacent to the outer edge of the semiconductor layered body 53, two fragmented first external connecting parts 51a each having an annular semicircular shape as seen in a plan view are arranged in the first direction so that one exposed part 53b is interpose therebetween.

For the exposed parts 53b adjacent to the second electrode 12, no first external connecting parts is disposed between those exposed parts 53b and the second electrode 12. The fragmented first external connecting parts 51a having an annular semicircular shape as seen in a plan view are arranged along the first direction on the opposing side to the second electrode 12 with reference to the column of the exposed parts.

For each of the exposed parts 53b arranged along the first direction while being adjacent to the outer edge of the semiconductor layered body 53, two first external connecting parts 71b are arranged in the sequent of one first external connecting part 51b, the exposed part 53b, and another first external connecting part 51b in the first direction so that the exposed part 53b is interposed between the two of the first external connecting parts 51b. The fragmented first external connecting parts 51b each have an annular semicircular shape in which one end thereof on the outer edge side of the semiconductor layered body 33 is elongated to the outer edge side thereof, as seen in a plan view.

For the exposed parts 53b adjacent to the outer edge of the semiconductor layered body 53, the first external connecting parts 51d are arranged between the exposed parts 53b and the outer edge of the semiconductor layered body 53 in the second direction while each having a band-like fragmented shape being recessed conforming to the outer shape of the exposed part 33b.

The fragmented first external connecting parts 51e 51c respectively adjacent to the outer edge or corners of the semiconductor layered body 53 are slightly deformed according to the size, position and the like of the exposed parts and the shape and the like of the semiconductor layered body 53 so that the fragmented first external connecting parts having the annular semicircular shape correspond to the outer edge of the semiconductor laminated body. However, the first external connecting parts have the same shape as the aforementioned shapes.

The first external connecting parts 51a to 51e are close proximity to each other while being spaced apart to each other.

Circular electrodes 51x are positioned one side of the outer edge of the semiconductor laminated body 53 while being each disposed between two adjacent first external connecting parts 51a each surrounding a exposed part. The electrodes 51x are connected to the first electrode 1 in a similar manner to the first external connecting parts. The electrodes 51x can be used as electrodes to which proves are connected when measuring the optical characteristics of the light emitting element.

The plurality of second external connecting parts 52 is arranged on the second electrode 12 having a band-like shape extending in the first direction while being positioned above the semiconductor layered body 53. The fragmented second external connecting parts 52 each have a substantially quadrangular shape having the corners rounded, the plurality of second external connecting parts 52 having substantially the same shapes are each arranged in the first direction at a substantially equal interval (i.e., 16 μm). Each second external connecting part 52 has a surface area equal to or substantially three times of one of the first external connecting parts 51a to 51e. Among the second external connecting pars 52, the second external connecting parts 52 positioned on both ends can be used for the electrodes to which proves are connected when measuring the optical characteristics of the light emitting element.

Such a light emitting element 50 can exhibit the same or a similar effect to the light emitting element 10, 30, 40, in other words, the light emitting element 50 can more firmly be connected to the mounting substrate or the like at the outer periphery of the light emitting element 50 by the first external connecting parts arranged along the outer periphery of the semiconductor layered body 53. Additionally, by making difference small between the surface area of the second external connecting parts and the surface area of the first external connecting parts, the first external connecting parts and the second external connecting parts are squashed by substantially the same amount when the light emitting element is flip-chip is mounted on a substrate, thereby enabling stable connection between the light emitting element and the substrate. Accordingly, stress is less likely to unevenly applied on the light emitting element. Further, this can also contribute to the flowability of the uncured resin material for forming the covering member which is described below. Thus, thermal stress can be reduced.

Sixth Embodiment

Figure 6:
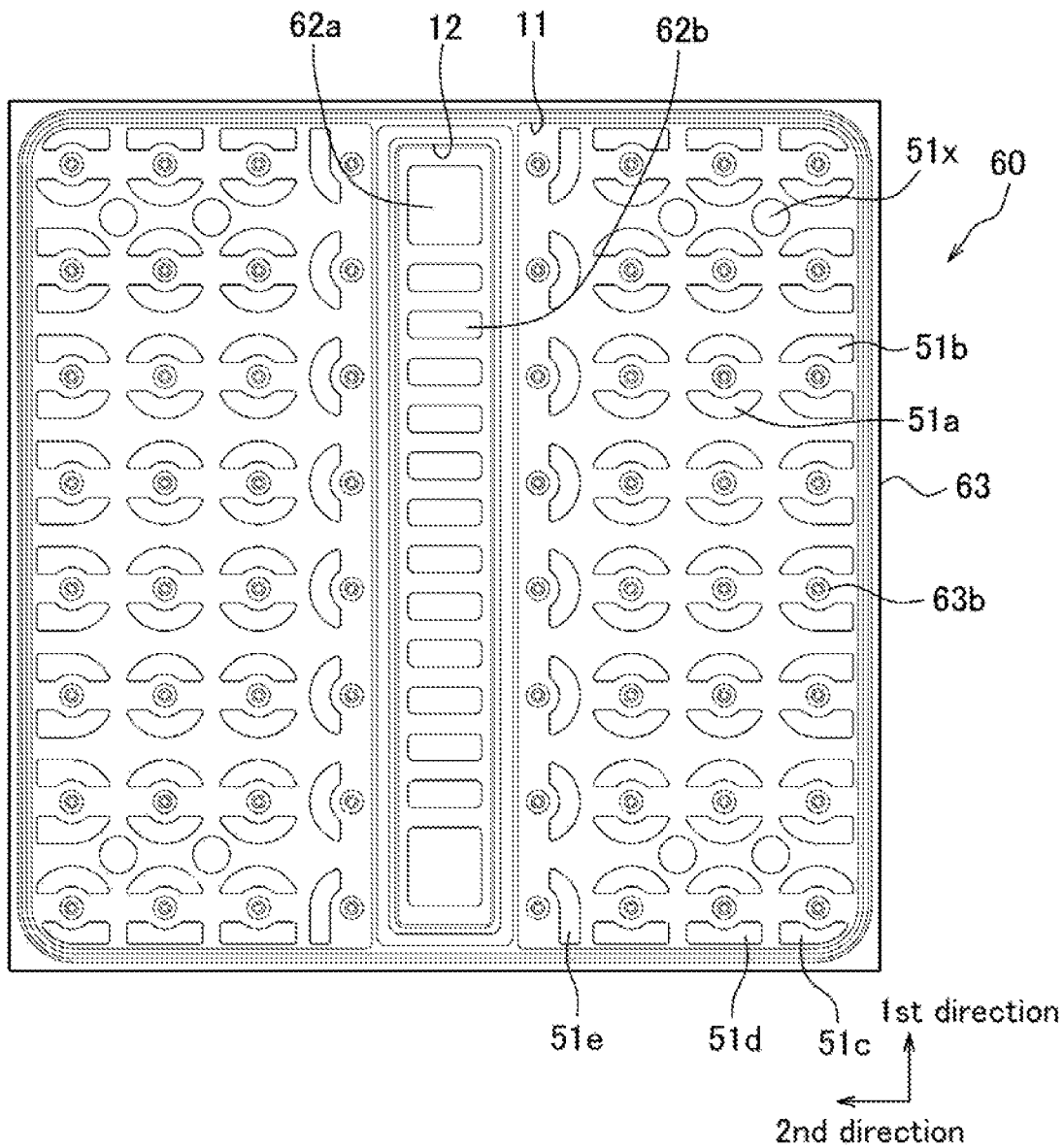
FIG. 6 is a plane view schematically showing a light emitting element according to a sixth embodiment of the present disclosure.

As shown in FIG. 6, a light emitting element 60 according to a sixth embodiment is substantially the same as the light emitting element 50 except for the shape of the second external connecting parts 52.

That is, shapes and positions of parts 63b, first external connecting parts 61a to 61e, and electrodes 61x are substantially the same as those of the light emitting element 50.

The fragmented second external connecting parts 62a, 62b are arranged on the second electrode 12. Among the second external connecting parts 62, 62b, the second external connecting parts 62a positioned on both ends thereof are relatively large size so as to be used as electrodes to which proves are connected when measuring the optical characteristics of the light emitting element. The plurality of second external connecting parts 62b are positioned between the second external connecting pars 62a while each having a smaller size than that of the second external connecting parts 62a. The second external connecting parts 62b are each positioned at substantially equal interval in the first direction. Each of the second external connecting parts 62b with smaller size may has a surface area equal to or about 1.5 times as great as the surface area of the first external connecting parts 51a to 51b.

Such a light emitting element 60 can exhibit the effect substantially the same as those of the light emitting element 10, 30, 40, 50. Further, by making difference small between the surface area of the second external connecting parts and the surface area of the first external connecting parts, the first external connecting parts and the second external connecting parts are squashed by substantially the same amount when the light emitting element is flip-chip is mounted on a substrate, thereby enabling stable connection between the light emitting element and the substrate. Accordingly, stress is less likely to unevenly applied on the light emitting element. Further, this can also contribute to the flowability of the uncured resin material for forming the covering member which is described below. Thus, thermal stress can be reduced.

Seventh Embodiment

Figure 7:
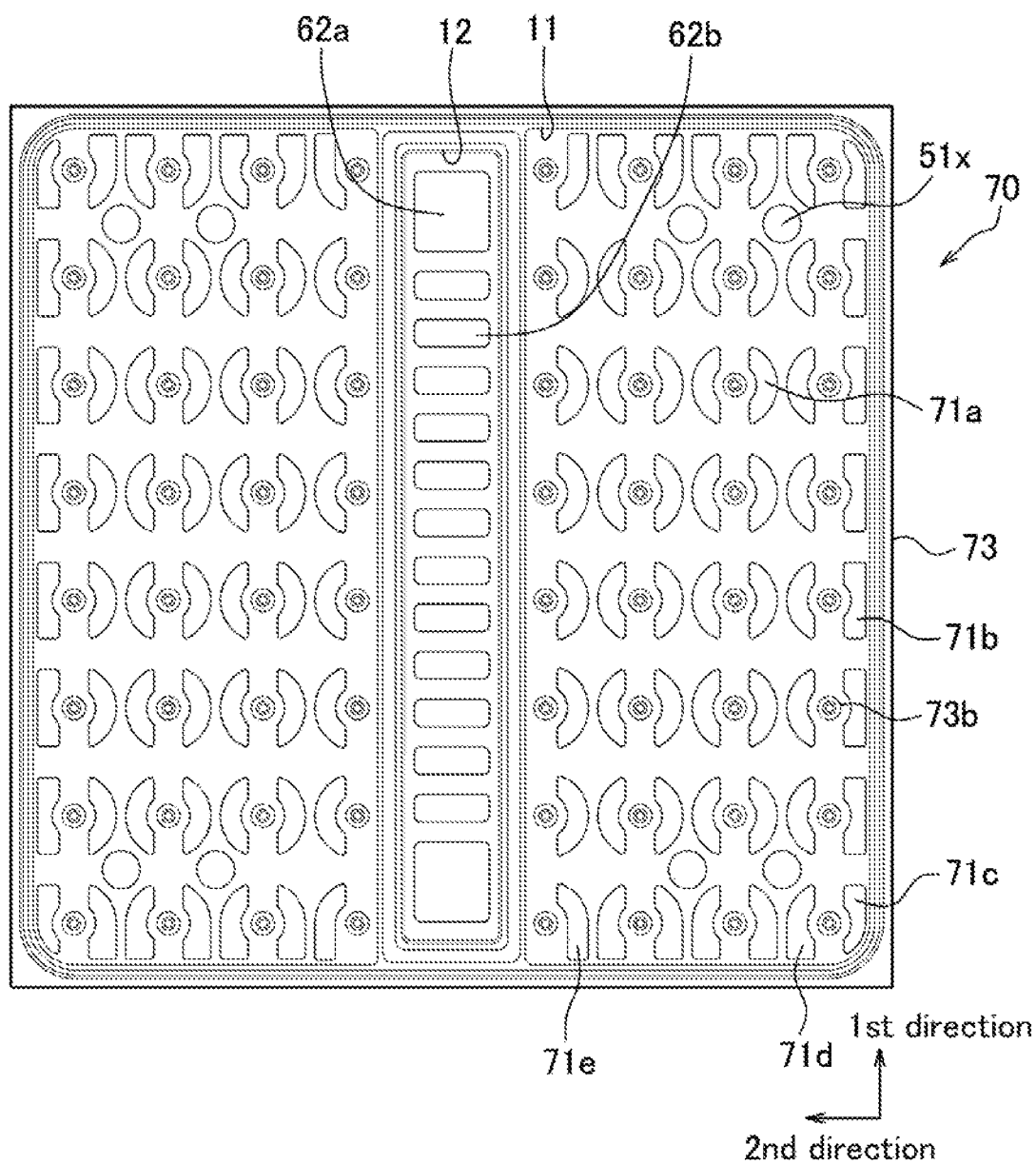
FIG. 7 is a plan view schematically showing a light emitting element according to a seventh embodiment of the present disclosure.

As shown in FIG. 7. a light emitting element 70 according to a seventh embodiment is substantially the same as the light emitting element 60 except for the shapes and positions of the first external connecting pars.

That is, shapes and positions of the second external connecting parts 62a, 62b are substantially the same as those of the light emitting element 60.

For some exposed parts 73b not being adjacent to the second electrode 12, two first external connecting parts 71a are arranged in the sequent of one first external connecting part 71a, the exposed part 73b, and another first external connecting part 71a in the second direction so that the exposed part 53b is interposed between the two of the first external connecting parts 71a.

For the exposed parts 73b being adjacent to the second electrode 12, no first external connecting part is disposed between those exposed parts 33b and the second electrode 12, and the first external connecting parts 51a are arranged along the first direction on the opposing side to the second electrode 12 with reference to the column of the exposed parts.

Arranging the fragmented first external connecting parts each having the annular semicircular along the first direction allows the afore-mentioned uncured resin material forming the covering member to easily flow along the first external connecting parts (so as to be called "capillary action").

The fragmented first external connecting parts 71b, 71c, 71d, 71e respectively adjacent to the outer edge or corners of the semiconductor layered body 73 are slightly deformed according to the size, position and the like of the exposed parts and the shape and the like of the semiconductor layered body 53 so that the fragmented first external connecting parts having the annular semicircular shape correspond to the outer edge of the semiconductor laminated body.

Such a light emitting element 70 can exhibit the effect substantially the same as those of the light emitting element 10, 30, 60. Further, adjusting the shapes and orientations of the first external connecting parts can control direction or speed of resin material to flow directly under the light emitting element. This can alleviate generation of voids and allow the covering member to be easily formed.

What is claimed is:

1. A light emitting element comprising:
   a semiconductor layered body including
      a first semiconductor layer,
      a light emitting layer, and
      a second semiconductor layer, with the light emitting layer being positioned between the first semiconductor layer and the second semiconductor layer,
      the first semiconductor layer being exposed from the light emitting layer and the second semiconductor layer at a plurality of exposed parts when viewed from a second semiconductor layer side of the semiconductor layered body;
   an insulating film covering the semiconductor layered body, the insulating film defining a plurality of openings respectively arranged above the plurality of exposed parts of the first semiconductor layer;
   a first electrode connected to the first semiconductor layer at the exposed parts through the openings in the insulating film, and partially arranged on the second semiconductor layer via the insulating film;
   a second electrode electrically connected to the second semiconductor layer;
   a plurality of first external connecting parts connected to the first electrode, the first external connecting parts being spaced apart from the exposed parts in a plan view, and at least two of the first external connecting parts being arranged between at least one set of adjacent ones of the exposed parts in the plan view; and
   at least one second external connecting part connected to the second electrode.

2. The light emitting element according to claim 1, wherein
   two or more of the first external connecting parts each have a shape corresponding to a part of a prescribed shape in the plan view, and
   the two or more of the first external connecting parts are arranged to interpose a corresponding one of the exposed parts therebetween in the plan view.

3. The light emitting element according to claim 1, wherein
   one of the first external connecting parts adjacent to an outer edge of the semiconductor layered body has a larger surface area than a surface area of one of the first external connecting parts not adjacent to the outer edge of the semiconductor layered body in the plan view.

4. The light emitting element according to claim 1, wherein
   the exposed parts are arranged in a matrix including a plurality of columns extending in a first direction parallel to an outer edge of a part of the semiconductor layered body and a plurality of rows extending in a second direction perpendicular to the first direction.

5. The light emitting element according to claim 4, wherein
   in the plan view, the second electrode has a shape elongated in the first direction.

6. The light emitting element according to claim 5, wherein
   the at least one second external connecting part has a shape elongated in the second direction.

7. The light emitting element according to claim 1, wherein
   in the plan view, none of the first external connecting parts is disposed between the second electrode and one of the exposed parts adjacent to the second electrode.

8. The light emitting element according to claim 1, wherein
the first external connecting parts each have a fragmented shape, and the exposed parts are each regularly surrounded by the first external connecting parts.

9. The light emitting element according to claim 2, wherein
the prescribed shape is a circular ring shape surrounding the corresponding one of the exposed parts.

10. The light emitting element according to claim 2, wherein
all of the first external connecting parts have the shape corresponding to a part of the prescribed shape in the plan view.

11. The light emitting element according to claim 1, further comprising
at least one additional second external connecting part, wherein
the second external connecting part and the at least one additional second external connecting part each have a shape corresponding to a part of a prescribed shape in the plan view, and
the second external connecting part and the at least one additional second external connecting part are spaced apart from each other in the plan view.

12. A light emitting device comprising:
a substrate including a wiring pattern on an upper surface;
the light emitting element according to claim 1, the light emitting element being flip-chip mounted on the wiring pattern via the first external connecting parts and the at least one second external connecting part; and
a covering member covering the substrate and the light emitting element including the first external connecting parts and the at least one second external connecting part.

13. The light emitting device according to claim 12, wherein
the covering member contains a light-reflective substance.

14. The light emitting device according to claim 12, wherein the covering member includes resin.

15. The light emitting device according to claim 12, wherein the substrate is one of alumina and aluminum nitride.

16. The light emitting device according to claim 12, further comprising a light-transmissive member at an upper surface of the light emitting element.

17. The light emitting device according to claim 16, wherein the light-transmissive member contains a fluorescent material.

* * * * *